(12) United States Patent
Chang et al.

(10) Patent No.: US 7,514,770 B2
(45) Date of Patent: Apr. 7, 2009

(54) STACK STRUCTURE OF CARRIER BOARD EMBEDDED WITH SEMICONDUCTOR COMPONENTS AND METHOD FOR FABRICATING THE SAME

(75) Inventors: Chia-Wei Chang, Hsin-chu (TW); Chung-Cheng Lien, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 176 days.

(21) Appl. No.: 11/467,310

(22) Filed: Aug. 25, 2006

(65) Prior Publication Data
US 2007/0085188 A1 Apr. 19, 2007

(30) Foreign Application Priority Data
Oct. 18, 2005 (TW) .............................. 94136265 A

(51) Int. Cl.
*H01L 23/02* (2006.01)
*H05K 3/30* (2006.01)
*H05K 1/16* (2006.01)

(52) U.S. Cl. ................... 257/678; 257/676; 257/686; 29/832; 174/260; 174/261; 174/262

(58) Field of Classification Search ................ 257/678, 257/676, 686; 29/832; 174/260, 261, 262
See application file for complete search history.

(56) References Cited

U.S. PATENT DOCUMENTS

| 6,759,272 | B2 * | 7/2004 | Tsubosaki et al. ............ 438/109 |
| 6,798,049 | B1 | 9/2004 | Shin et al. |
| 2005/0184377 | A1 * | 8/2005 | Takeuchi et al. ............. 257/686 |
| 2007/0084628 | A1 * | 4/2007 | Chang et al. ................. 174/260 |

* cited by examiner

*Primary Examiner*—Long K Tran
(74) *Attorney, Agent, or Firm*—Foley & Lardner LLP

(57) ABSTRACT

A stack structure of a carrier board embedded with semiconductor components and a method for fabricating the same are proposed. The stack structure includes first and second carrier boards having a through hole respectively, first and second semiconductors component disposed in through holes of the first and second semiconductor components respectively, and a dielectric layer structure clamped between the first carrier board and the second carrier board and having a first dielectric layer formed on the first carrier board and an inactive surface of the first semiconductor component and filled in gaps between the first carrier board and the first semiconductor component, a second dielectric layer formed on the second carrier board and an inactive of the second semiconductor component and filled in gaps between the second carrier board and the second semiconductor component, and a bonding layer clamped between the first dielectric layer and the second dielectric layer.

3 Claims, 4 Drawing Sheets

US 7,514,770 B2

STACK STRUCTURE OF CARRIER BOARD EMBEDDED WITH SEMICONDUCTOR COMPONENTS AND METHOD FOR FABRICATING THE SAME

FIELD OF THE INVENTION

This invention relates to a stack structure of a carrier board embedded with semiconductor components and a method for fabricating the same, and more particularly, to a stack structure of a carrier board embedded with semiconductor components and a method for fabricating the same by embedding the semiconductor components into the carrier board and then stacking the carrier board.

DESCRIPTION OF RELATED ART

With the rapid development of electronic industry, electronic devices are designed to have multiple functions and brilliant performance, so as to meet the package requirements of integration and miniaturization for semiconductor packages. In order to have great capacity and high functionality, a modern semiconductor package is designed in the form of a multi-chip module (MCM). Such an MCM has a reduced dimension and better electricity functionality, and is becoming one of the main trend packages in the art. As disclosed in U.S. Pat. No. 6,798,049, at least two semiconductor components are disposed on a chip carrier component of a single package component, and both of the semiconductor components are stacked on the carrier component.

FIG. 1 is a cross sectional view of a Cavity-Down Ball Grid Array (CDBGA) package component disclosed in U.S. Pat. No. 6,798,049. The CDBGA comprises a circuit board 10, a through hole 101 formed on the circuit board 10, a circuit layer 11 having a plurality of electrical conductive pads 11a and a plurality of bonding pads 11b formed on the circuit board 10, two stacked semiconductor components 121 and 122 formed in the through hole 101, a connection layer 13 formed between the semiconductor components 121 and 122 for electrically connecting the semiconductor components 121 and 122, the conductive elements 14 such as gold wires electrically connected to the bonding pads 11b of the circuit layer 11, an encapsulant 15 encapsulated in the through hole 101 of the circuit board 10 and on the semiconductor components 121 and 122 and conductive elements 14, an insulation protection layer 16 formed on the circuit layer 11, a plurality of openings 16a formed on the insulation protection layer 16 for exposure of the electrical conductive pads 11a, and the conductive elements 17 such as a solder balls formed in the openings 16a.

However, the semiconductor components 121 and 122 are electrically connected to the circuit layer 11 by a wire bonding technique, and bonding wires formed by the wire bonding technique have an arc shape, so the CDBGA has too thick a structure, which is contrary to the objection of compactness. Moreover, because two processes, a stacking process and a packaging process, have to perform subsequently to stack and electrically connect the first semiconductor components 121 and 122, so a manufacturing process to manufacture the CDBGA is complicated and the CDBGA has therefore a high cost.

The CDBGA cannot gain better electricity and modularization functionality unless it comprises more layers of stacked structure. The CDBGA has to have a more complicated circuit layer 11, and more bonding pads 11b on the circuit layer 11. However, in order to increase a circuit density and a number of bonding pads 11b of the circuit layer 11, which has a limited circuit area, the circuit board 10, which is used for carrying the semiconductor components 121 and 122, has to have thinned circuitry, which makes, however, less contribution to the area reduction of the circuit board 10. Moreover, only a limited number of semiconductor components are allowed to be stacked on the circuit board 10 by using the above method for stacking the semiconductor components 121 and 122. The CDBGA can gain less electricity functionality.

Therefore, how to increase the density of MCMs on a multi-layered circuit board, decrease an area where semiconductor components are disposed on the multi-layered circuit board, reduce the dimension of a semiconductor component, simplify a process for manufacturing the semiconductor component and reduce the cost of the manufactured semiconductor component have becoming one of the most important issues in the art.

SUMMARY OF THE INVENTION

In views of the above-mentioned problems of the prior art, it is a primary objective of the present invention to provide a stack structure of a carrier board embedded with semiconductor components and a method for fabricating the same by embedding the semiconductor components into the carrier board, so as to form a modularized structure.

It is another objective of the present invention to provide a stack structure of a carrier board embedded with semiconductor components and a method for fabricating the same, the stack structure being designed to include a number of semiconductor components in accordance with practical demands.

It is a further objective of the present invention to provide a stack structure of a carrier board embedded with semiconductor components and a method for fabricating the same, for utilizing the space of the carrier board efficiently and reducing the dimension of the modularized structure.

It is still another objective of the present invention to provide a stack structure of a carrier board embedded with semiconductor components and a method for fabricating the same, for simplify a semiconductor packaging process and reducing a manufacturing cost.

To achieve the above-mentioned and other objectives, a method for fabricating a stack structure of a carrier board embedded with semiconductor components is provided according to the present invention. The method includes providing a first carrier board and a second carrier board, both of which having a through hole, forming a first laminating layer and a second laminating layer on the first and second carrier boards respectively for covering the through holes of the first and second carrier boards, and disposing in the through holes of the first and second carrier boards a first semiconductor component and a second semiconductor component respectively, both of the first and second semiconductor components having an active surface and an inactive surface opposed to the active surface; forming a first and second protection layers on the first and second carrier boards where the first and second laminating layers are not formed and the active surfaces of the first and second semiconductor components respectively; laminating the first laminating layer, the first carrier board and the first protection layer, so as to form a first carry structure embedded with the first semiconductor component, and laminating the second laminating layer, the second carrier board and the second protection layer, so as to form a second carry structure embedded with the second semiconductor component; and clamping a bonding layer with the first and second carry structures, which are disposed in a back to back manner, and laminating the first and second carry structures.

According to the preferred embodiment, the first and second carrier boards are an insulated board or a circuit board having circuitry; the first laminating layer includes a first dielectric layer and a first removable layer; the first dielectric layer is formed on the first carrier board; the second laminating layer includes a second dielectric layer and a second removable layer; the second dielectric layer is formed on the second carrier board; the and second removable layers are a release film or a copper foil.

The method further includes in laminating the first laminating layer, the first carrier board and the first protection layer, the first dielectric layer is the first laminating layer is pressed and filled in gaps between the first carrier board and the first semiconductor component, so as to dispose the first semiconductor component in the through hole of the first carrier board, and the first removable layer is removed, so as to form a first carry structure; in laminating the second laminating layer, the second carrier board and the second protection layer, the second dielectric layer in the second laminating layer is pressed and filled in gaps between the second carrier board and the second semiconductor component, so as to dispose the second semiconductor component in the through hole of the second carrier board, and the second removable layer is then removed, so as to form a second carry structure; a bonding layer is clamped between the first and second carry structures, and the first and second carry structures are pressed to form a core layer embedded with the first and second semiconductor components.

The method further includes removing the first and second protection layers and forming on two surfaces of the core layer first and second build-up structures, each of which includes a dielectric layer, a circuit layer stacked on the dielectric layer, and a conductive structure formed in the dielectric layer for electrically connecting the circuit layer to the first and second semiconductor components. The method further includes forming a plurality of plated through holes penetrating the core layer and the first and second build-up structure and electrically connected to the first and second build-up structures. The method further includes forming first and second solder masks on external surfaces of the first and second build-up structures.

Fabricated in accordance with the above-described method, a stack structure of a carrier board embedded with semiconductor components includes a first carrier board and a second carrier board, both of which are provided with a through hole; a first semiconductor component and a second semiconductor component disposed in the through holes of the first and second semiconductor components respectively, each of the first and second semiconductor components having an inactive surface and an active surface opposed to the inactive surface and formed with a plurality of electrode pads; and a dielectric layer structure clamped between the first carrier board and the second carrier board and comprising a first dielectric layer formed on the first carrier board and the inactive surface of the first semiconductor component and filled in gaps between the first carrier board and the first semiconductor component, a second dielectric layer formed on the second carrier board and the inactive of the second semiconductor component and filled in gaps between the second carrier board and the second semiconductor component, and a bonding layer clamped between the first dielectric layer and the second dielectric layer.

The stack structure further includes a first build-up structure and a second build-up structure, which are formed on external surfaces of the first and second carrier boards. Each of the first and second build-up structures includes a dielectric layer, a circuit layer stacked on the dielectric layer, and a plurality of conductive structures formed in the dielectric layer for electrically connecting the circuit layer to the electrode pads of a semiconductor component. The stack structure further includes a plurality of plated through holes penetrating the first and second carrier boards, the first and second build-up structures and the dielectric layer structure and electrically connected to the first and second build-up structures. The stack structure further includes a first solder mask and a second solder mask, which are formed on external surfaces of the first and second build-up structures respectively.

Since the semiconductor components are embedded into the first and second carrier boards, and the an core layer is formed by clamping a bonding layer between the first and second carrier boards, a modularized structure is formed, so as to utilize the space of the carrier board efficiently and reduce the dimension of the modularized structure. Further, the modularized structure can have varieties of combinations in accordance with practical demands. In conclusion, compared with the prior art, the stack structure of the carrier board embedded with semiconductor components and the method for fabricating the same can indeed simplify a semiconductor packaging process and reduce a fabricating cost.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2G are used for demonstrating a method for fabricating a stack structure of a carrier board embedded with semiconductor components according to the present invention.

Figure 1:
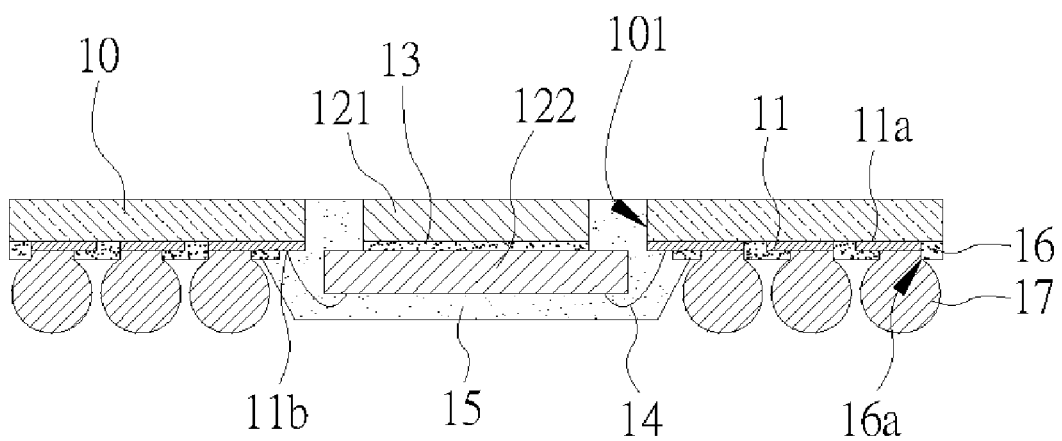
FIG. 1 is a cross sectional view of a CDBGA disclosed in U.S. Pat. No. 6,798,049.
Figure 2A:
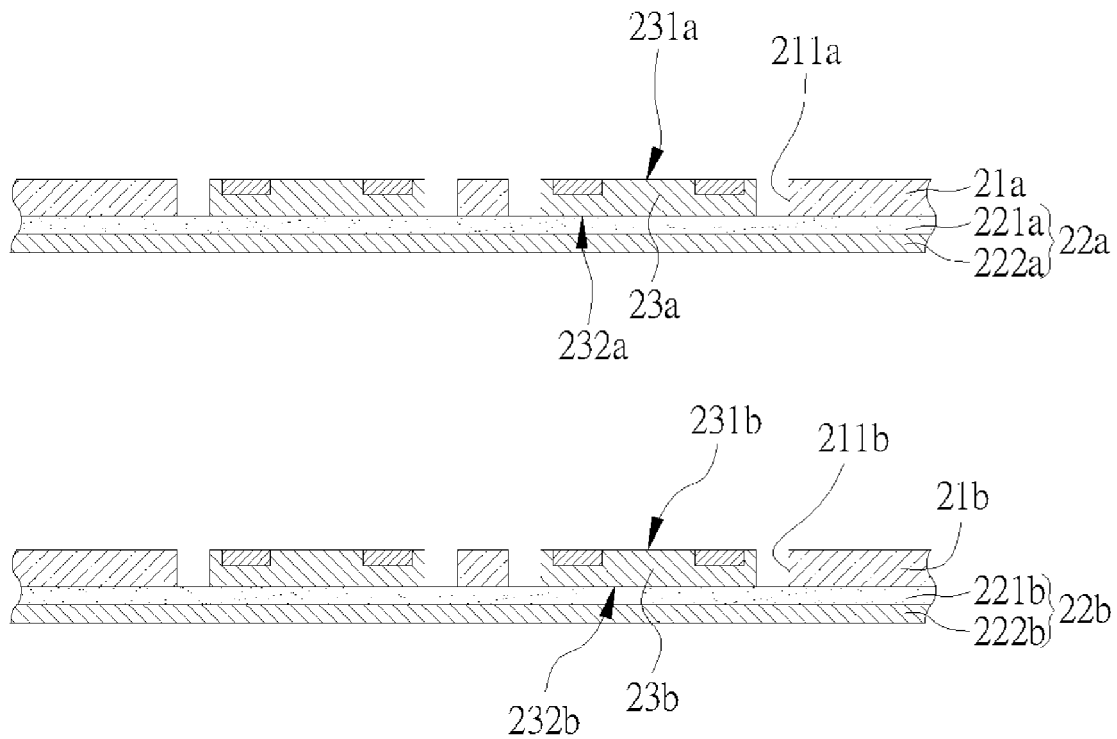
FIGS. 2A to 2G are seven cross sectional views of a stack structure of a carrier board embedded with semiconductor components according to the present invention.
Figure 2B:
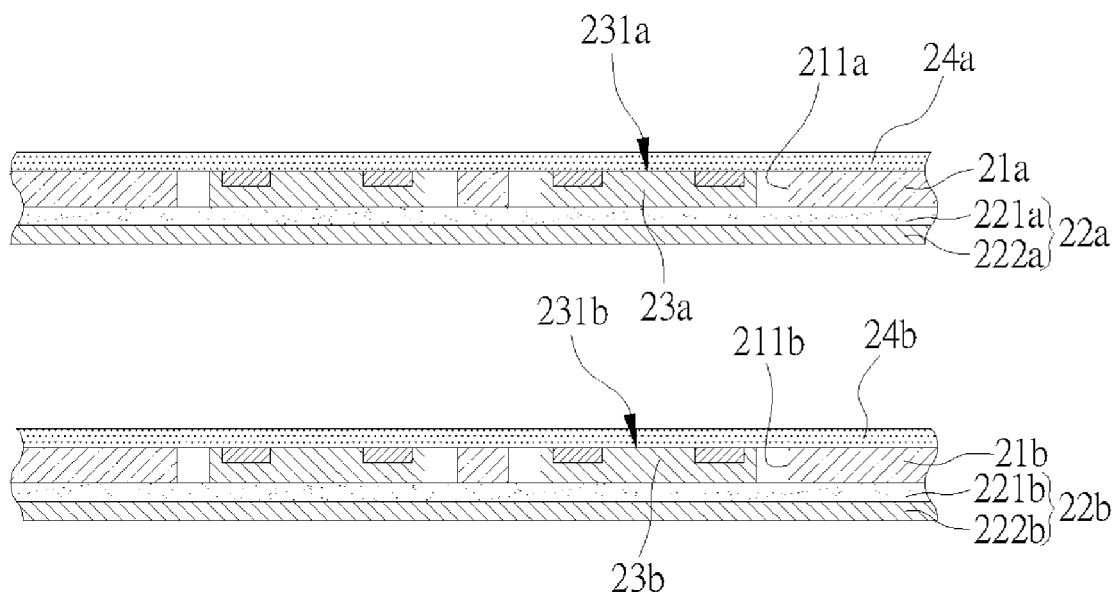

Please refer to FIG. 2A, which shows a first carrier board 21a and a second carrier board 21b of the present invention. Two through holes 211a and 211b are formed in the first and second carrier boards 21a and 21b respectively. Both the first and second carrier boards 21a and 21b is an insulated board or a circuit board having circuitry. A first laminating layer 22a and a second laminating layer 22b are formed on the first and second carrier boards 21a and 21b respectively, for sealing one end of through holes 211a and 211b.

The first laminating layer 22a comprises a first dielectric layer 221a and a first removable layer 222a. The first dielectric layer 221a is formed on the first carrier board 21a. The second laminating layer 22b comprises a second dielectric layer 221b and a second removable layer 222b. The second dielectric layer 221b is formed on the second carrier board 21b. At least one of the first and second dielectric layer 221a and 211b comprises epoxy resin, polyimide, cyanate ester, glass fiber, bismaleimide Triazine (BT) or a combination of glass fiber and epoxy resin, and is in liquid state in a high temperature environment. At least one of the first and second removable layers 222a and 222b comprises a release film or a copper foil.

At least a first semiconductor component 23a and second semiconductor component 23b are disposed in the through holes 211a and 211b respectively. The first semiconductor component 23a comprises an active surface 231a and an inactive surface 232a opposed to the active surface 231a. The second semiconductor component 23b comprises an active surface 231b and an inactive surface 232b opposed to the active surface 232a. Both of the inactive surfaces 232a and 232 are disposed in the through holes 211a and 211b by an adhering material.

Please refer to FIG. 2. A first protection layer 24a such as a bonding tape is formed on the first carrier board 21a where the first laminating layer 22a is not formed and on the active surface 231a of the first semiconductor component 23a. A second protection layer 24b is formed on the second carrier board 21b where the second laminating layer 22b is not formed and on the active surface 231b of the second semiconductor component 23b. The first and second protection layers 24a and 24b are both used for protecting the active surfaces 231a and 231b of the first and second semiconductor component 23a and 23b from damage or contamination.

Figure 2C:
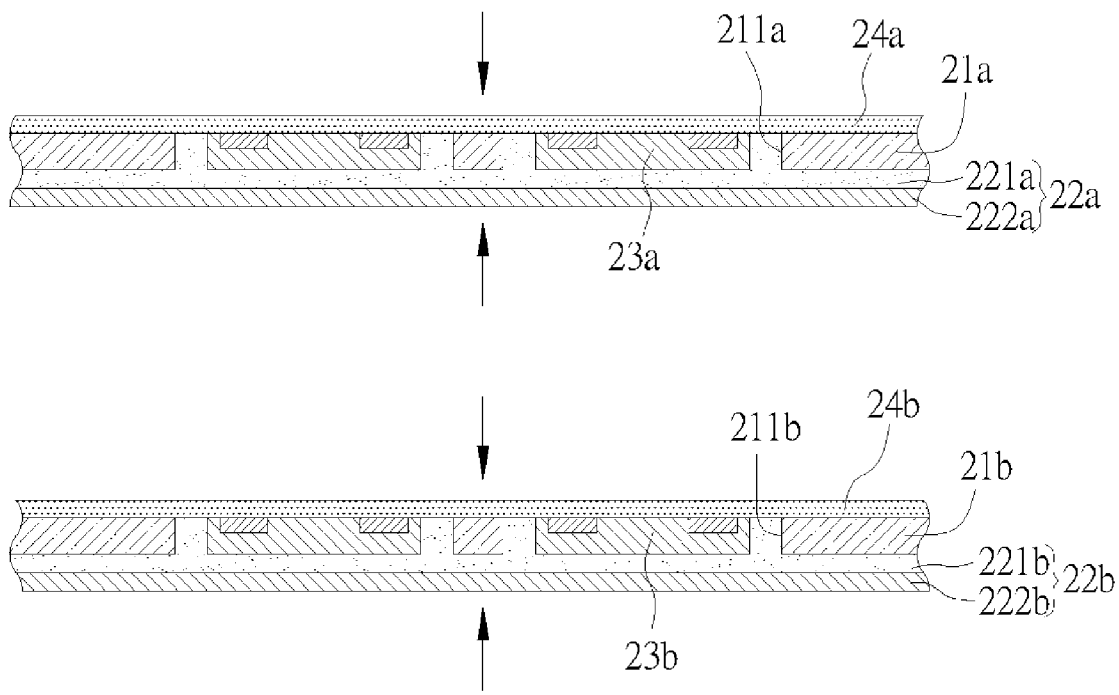
Figure 2D:
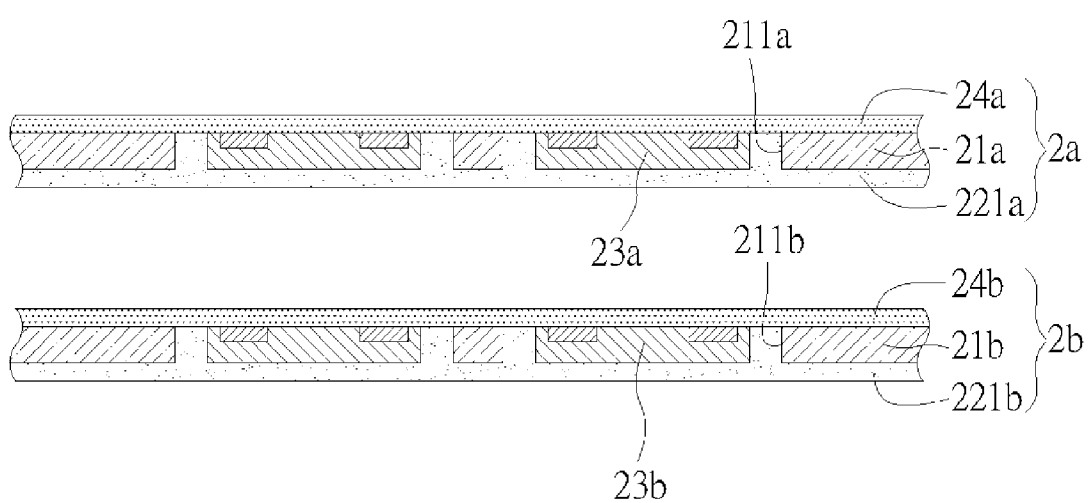

Please refer to FIG. 2C. The first laminating layer 22a, first carrier board 21a and first protection layer 24a are heated, and the first dielectric layer 221a of the first laminating layer 22a is filled in gaps between the first carrier board 21a and the first semiconductor component 23a in the directions shown in FIG. 2C. The second laminating layer 22b, second carrier board 21b and second protection layer 24b, and the second dielectric layer 221b of the second laminating layer 22b is filled in gaps between the second carrier board 21b and the second semiconductor component 23b in the directions shown in FIG. 2C. After the first and second laminating layers 22a and 22b are cured, a first removable layer 222a formed on an external surface of the first laminating layer 22a and a second removable layer 222b formed on an external surface of the second laminating layer 22b are both removed, so as to form a first carry structure 2a embedded with the first semiconductor component 23a and a second carry structure 2b embedded with the second semiconductor component 23b, as shown in FIG. 2D.

It should be noted that the first and second removable layer 222a and 222b, if comprising the release film, are both removed by a physical method, or, if comprising the copper foil, are both removed by a chemical etching method. In an etching process, both of the first and second dielectric layers 221a and 221b are coarsened simultaneously. Therefore, the first carry structure 2a is easily bonded to the second carry structure 2b in a subsequent bonding process.

Figure 2E:
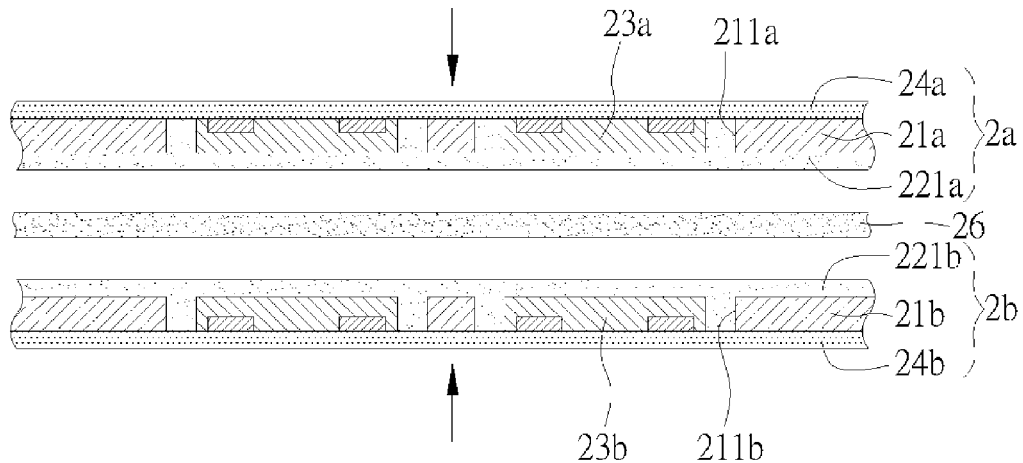
Figure 2F:
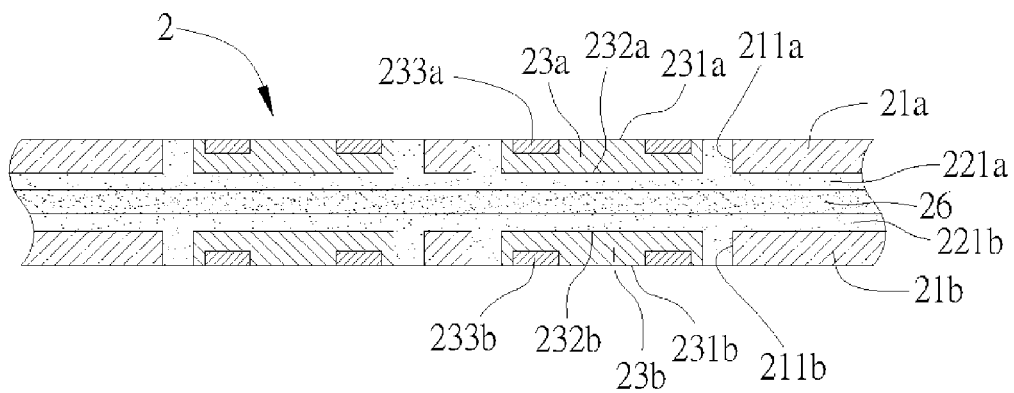

Please refer to FIG. 2E. The first carry structure 2a and the second carry structure 2b are disposed back to back, where the first and second dielectric layers 221a and 221b are formed respectively, to clamp a bonding layer 26, and are pressed in the directions shown in FIG. 2E. The first protection layer 24a on the first carry structure 2a and the second protection layer 24b on the second carry structure 2b are removed, so as to form a core layer 2 embedded with the first and second semiconductor components 23a and 23b, as shown in FIG. 2F. As described previously, if the first and second removable layer 222a and 222b comprise the copper foil, the first and second dielectric layers 221a and 221b are coarsened in the etching process. Therefore, the first and second dielectric layers 221a and 221b and the bonding layer 26 of the core layer 2 are easily bonded together.

Figure 2G:
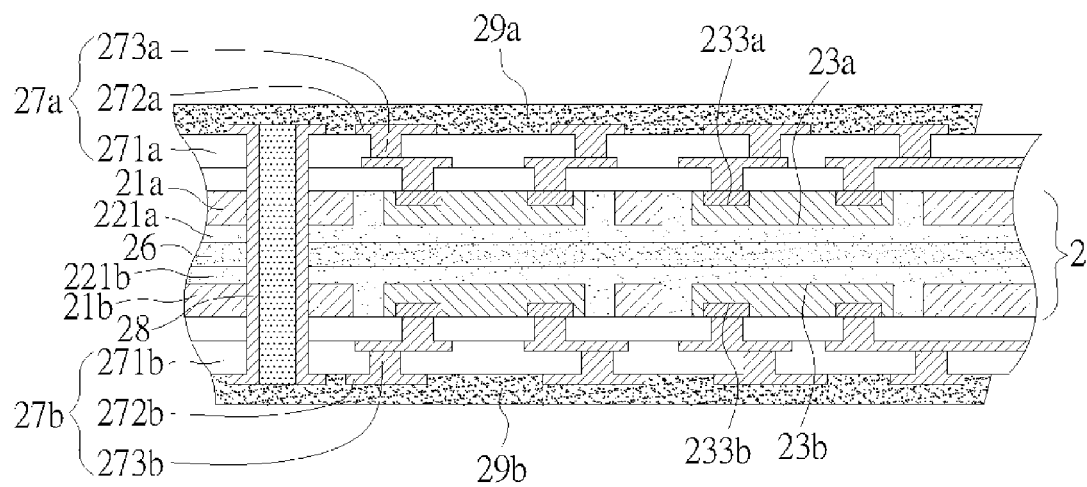

Please refer to FIG. 2G. A first build-up structure 27a and a second build-up structure 27b are formed on two surfaces of the core layer 2 respectively. The first build-up structure 27a comprises a dielectric layer 271a, a circuit layer 272a stacked on the dielectric layer 271a, and a conductive structure 273a formed in the dielectric layer 271a. The conductive structures 273a are electrically connected to the electrode pads 233a of the first semiconductor component 23a. The second build-up structure 27b comprises a dielectric layer 271b, a circuit layer 272b stacked on the dielectric layer 271b, and a conductive structure 273b formed in the dielectric layer 271b. The conductive structures 273b are electrically connected to the electrode pads 233b of the second semiconductor component 23b. A plurality of plated through holes (PTH) 28 are formed to penetrate the core layer 2, the first build-up structure 27a and second build-up structure 27b, and to electrically connect the first build-up structure 27a to the second build-up structure 27b. Finally, a first solder mask 29a and a second solder mask 29b are formed on external surfaces of the first build-up structure 27a and second build-up structure 27b respectively.

It should be noted that the present invention is not limited to comprises only two build-up structures, i.e. the first and second build-up structures 27a and 27b, as shown in FIG. 2G, but can comprise any numbers of build-up structures in accordance with practical demands.

Fabricated in accordance with the above method, a stack structure of a carrier board embedded with semiconductor components of the present invention, as shown in FIG. 2F, comprises the first carrier board 21a, the second carrier board 21b, the through holes 211a and 211b formed in the first and second carrier boards 21a and 21b respectively, and the first and second semiconductor components 23a and 23b disposed in the through holes 211a and 211b respectively. The first and second semiconductor components 23a and 23b comprises the inactive surfaces 233a and 233b and the active surfaces 231a and 231b opposed to the inactive surfaces 233a and 233b and provided with the electrode pads 233a and 233b. The stack structure of the carrier board further comprises a dielectric layer structure disposed between the first carrier board 21a and the second carrier board 21b. The dielectric layer structure comprises the first dielectric layer 221a, the second dielectric layer 221b and the bonding layer 26. The first dielectric layer 221a is formed on the first carrier board 21a and the inactive surface 232a of the first semiconductor component 23a, and filled in the gaps between the first carrier board 21a and the first semiconductor component 23a. The second dielectric layer 221b is formed on the second carrier board 21b and the inactive surface 232b of the second semiconductor component 23b, and filled in the gaps between the second carrier board 21b and the second semiconductor component 23b. The bonding layer 26 is bonded between the first dielectric layer 221a and the second dielectric layer 221b.

The above-described stack structure of the carrier board, as shown in FIG. 2G, further comprises the first build-up structure 27a and second build-up structure 27b, which are formed on the external surfaces of the first and second carrier boards 21a and 21b. The first and second build-up structures 27a and 27b comprises the dielectric layers 271a and 271b, the circuit layers 272a and 272b stacked on the dielectric layers 271a and 271b, and conductive structures 273a and 273b formed in the dielectric layer structures 271a and 271b for electrically connecting the circuit layers 272a and 272b to the electrode pads of the first and second semiconductor components 23a and 23b, the plated through holes 28 which penetrate the first and second carrier boards 21a and 21b, the first and second build-up structures 27a and 27b and the dielectric layer structures 271a and 271b and are electrically connected to the first and second circuit layers 272a and 272b, and the first and second solder masks 29a and 29b formed on the external surfaces of the first and second build-up structures 27a and 27b respectively.

Since the first and second carrier boards 21a and 21b are embedded with a plurality of semiconductor components, if the semiconductor components are memory chips, a memory device comprising the first and second carrier boards 21a and 21b can have greater data storage capacity. Moreover, because the first and second semiconductor components 23a and 23b are embedded in the through holes 211a and 211b of the first and second carrier boards 21a and 21b, and then the first carrier board 21a is stacked on the second carrier board 21b, to form a modularized structure, the spaces of the first and second carrier boards 21a and 21b are utilized efficiently and the modularized structure has a compact dimension. Further, the modularized structure can have varieties of combinations in accordance with practical demands. In conclusion, compared with the prior art, the stack structure of the carrier board embedded with semiconductor components and the method for fabricating the same can indeed simplify a semiconductor packaging process and reduce a fabricating cost.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A stack structure of a carrier board embedded with semiconductor components, the stack structure comprising:
    a first carrier board and a second carrier board, both of which are provided with a through hole;
    a first semiconductor component and a second semiconductor component disposed in the through holes of the first and second semiconductor components respectively, each of the first and second semiconductor components having an inactive surface and an active surface opposed to the inactive surface and formed with a plurality of electrode pads;
    a dielectric layer structure clamped between the first carrier board and the second carrier board and comprising a first dielectric layer formed on the first carrier board and the inactive surface of the first semiconductor component and filled in gaps between the first carrier board and the first semiconductor component, a second dielectric layer formed on the second carrier board and the inactive of the second semiconductor component and filled in gaps between the second carrier board and the second semiconductor component, and a bonding layer clamped between the first dielectric layer and the second dielectric layer;
    a first build-up structure and a second build-up structure formed on external surfaces of the first and second carrier boards respectively, both of the first and second build-up structures comprising a dielectric layer, a circuit layer stacked on the dielectric layer, and a plurality of conductive vias formed in the dielectric layer for electrically connecting the circuit layer to the electrode pads of the semiconductor components; and
    a plurality of plated through holes penetrating the first and second carrier boards, the dielectric layer structure, and the first and second build-up structures and electrically connected to the first and second build-up structures,
    wherein both of the first and second dielectric layers comprises a coarsened surface for disposition of the bonding layer.

2. The stack structure of claim 1, wherein at least one of the first and second carrier boards is an insulated board or a circuit board having circuitry.

3. The stack structure of claim 1, further comprising a first solder mask and a second solder mask formed on external surfaces of the first and second build-up structures.

* * * * *